United States Patent
Tsai (10) Patent No.: US 7,528,000 B2
(45) Date of Patent: May 5, 2009

(54) METHOD OF FABRICATING OPTICAL DEVICE CAPS

(75) Inventor: Chun-Wei Tsai, Hualien County (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 136 days.

(21) Appl. No.: 11/735,501

(22) Filed: Apr. 16, 2007

(65) Prior Publication Data

US 2008/0213937 A1    Sep. 4, 2008

(30) Foreign Application Priority Data

Mar. 1, 2007    (TW) ............................... 96106989 A (51) Int. Cl.
*H01L 21/00* (2006.01)

(52) U.S. Cl. ............................ 438/65; 438/26; 438/456; 438/458; 257/680; 257/E21.127

(58) Field of Classification Search .................. 438/112, 438/118, 455, 456, 680; 257/E21.505, E21.127, 257/E23.193
See application file for complete search history.

(56) References Cited

U.S. PATENT DOCUMENTS 7,247,517 B2 *   7/2007   Rumer et al. ................ 438/107
2007/0161210 A1 *  7/2007   Shao et al. ................... 438/455

OTHER PUBLICATIONS

Ito et al., "A rapid and selective anodic bonding method", The 8th International Conference on Solid State Sensors and Actuators and Eurosensors IX, Sweden, p. 277-280, Jun. 25-29, 1995.*

* cited by examiner

*Primary Examiner*—Charles D. Garber
*Assistant Examiner*—Yasser A. Abdelaziez
(74) *Attorney, Agent, or Firm*—Winston Hsu (57) ABSTRACT

A wafer having a plurality of through holes is provided, and a glass wafer is disposed on the wafer. A plate having a plurality of concave cavities is disposed on the glass wafer, wherein the concave cavities corresponding to the through holes of the wafer so that a part of the plate corresponding to the through holes is not in contact with the glass wafer. A voltage source is provided, and two electrodes thereof respectively have electrical connections to the wafer and the plate. The wafer and the glass wafer are bonded to each other by the anodic bonding method so that a plurality of optical device caps are formed.

6 Claims, 14 Drawing Sheets

METHOD OF FABRICATING OPTICAL DEVICE CAPS

BACKGROUND OF THE INVENTION

1. Field of the Invention

The present invention relates to a method of fabricating optical device caps, and more particularly, to a method of fabricating optical device caps so as to provide a good hermetic sealing, good penetrability and be able to package in wafer level.

2. Description of the Prior Art

In manufacturing processes, the microelectromechanical products with various kinds of applications and types will have different packaging processes. A wafer level package (WLP) is a semiconductor package in which the size of a finished package is similar to or slightly larger than a semiconductor die. After completion of all test processes and assembly processes or packaging processes, individual semiconductor packages are separated from a wafer having a plurality of semiconductor dies. Therefore WLP not only decreases a size of a memory module, but also satisfies a demand for high density.

Figure 1:
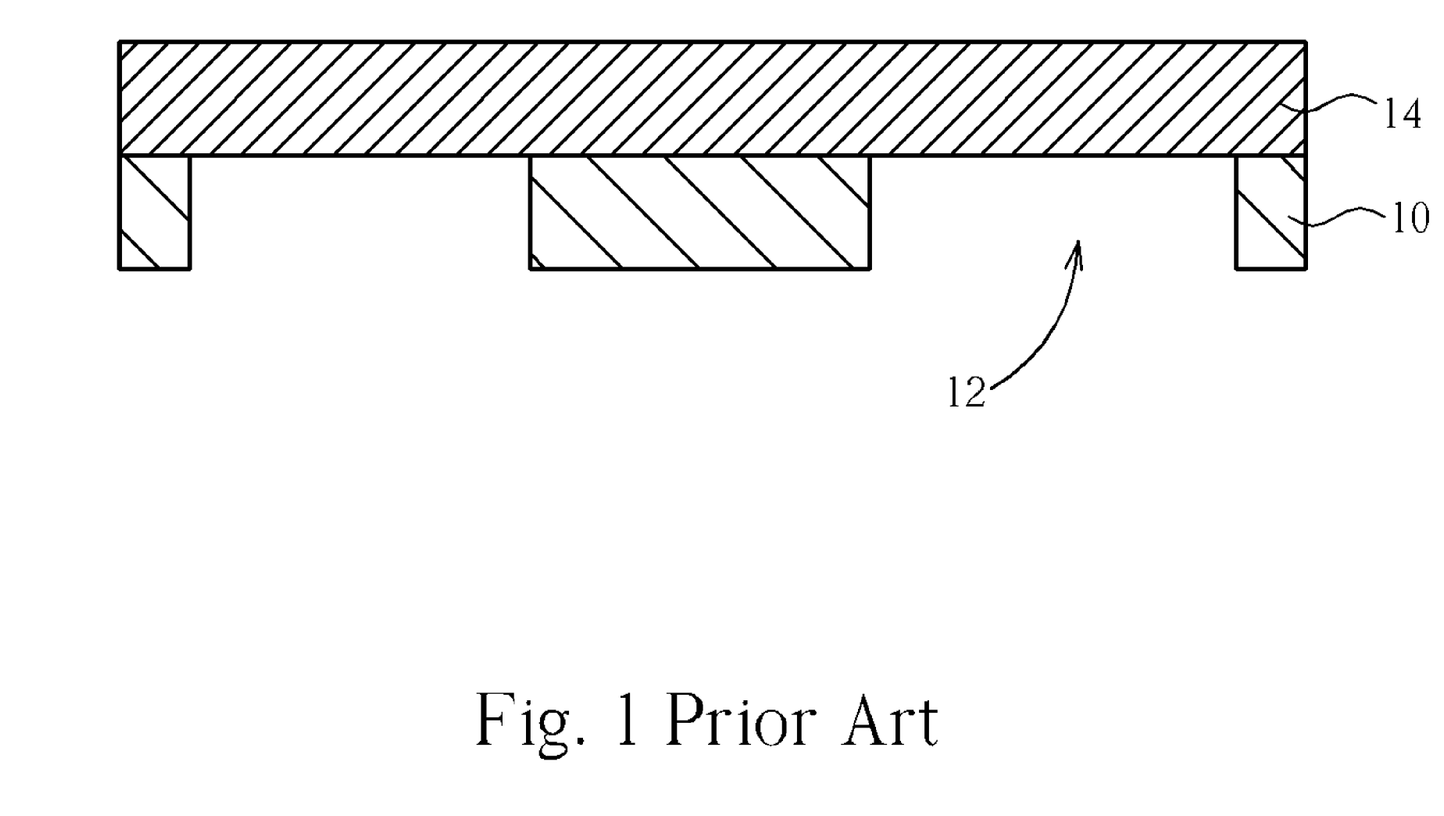
FIG. 1 through FIG. 3 are schematic diagrams illustrating a method of fabricating optical device caps according to the prior art.
Figure 2:
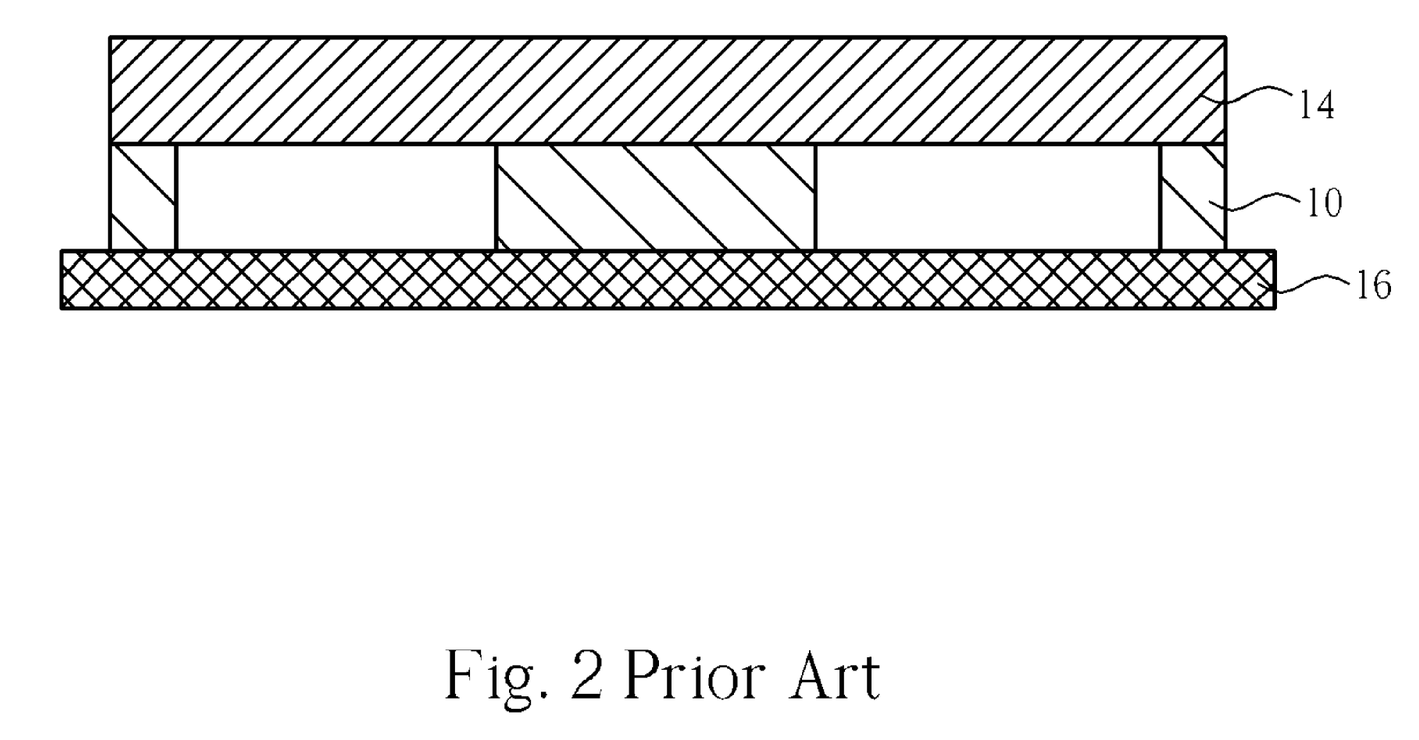
Figure 3:
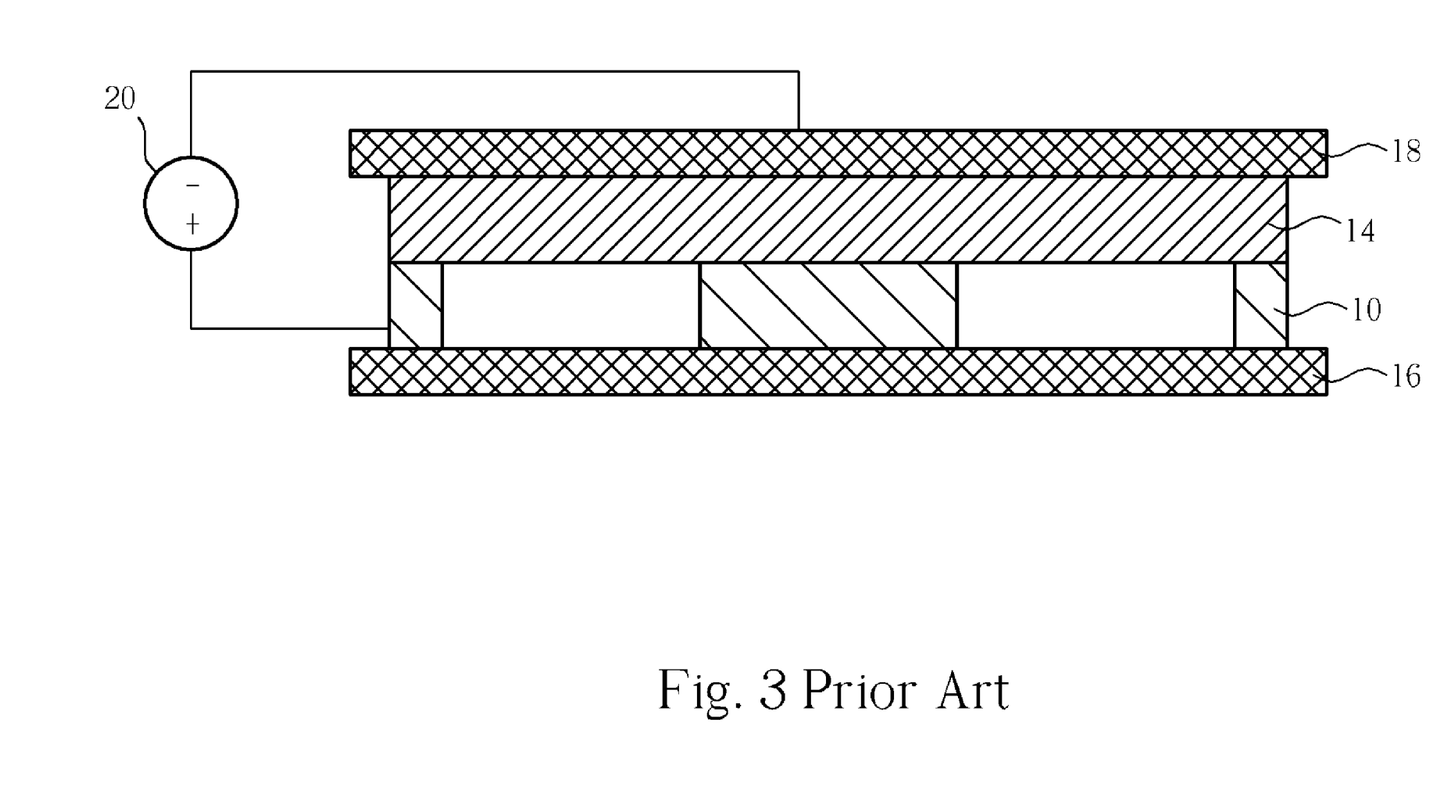

Please refer to FIG. 1 through FIG. 3. FIG. 1 through FIG. 3 are schematic diagrams illustrating a method of fabricating optical device caps according to the prior art. As shown in FIG. 1, a wafer 10 is provided, and a plurality of through holes 12 is formed on the wafer 10 by a lithographic process and an etching process. Then, a glass wafer 14 is disposed on the wafer 10. As shown in FIG. 2, a heat conducting plate 16 is provided, and the wafer 10 is disposed on the heat conducting plate 16. As shown in FIG. 3, a plate 18 is provided, and the glass wafer 14 is disposed on the plate 18. The interface between the plate 18 and the glass wafer 14 is flat. Next, a voltage source 20 is provided, and an anode and a cathode of the voltage source 20 are respectively electrically connected to the wafer 10 and the plate 18. Then, an anodic bonding process is performed, and a high voltage is provided between the wafer 10 and the plate 18. Also, the heat conducting plate 16 heats the wafer 10 and the glass wafer 14 to a high temperature.

Figure 4:
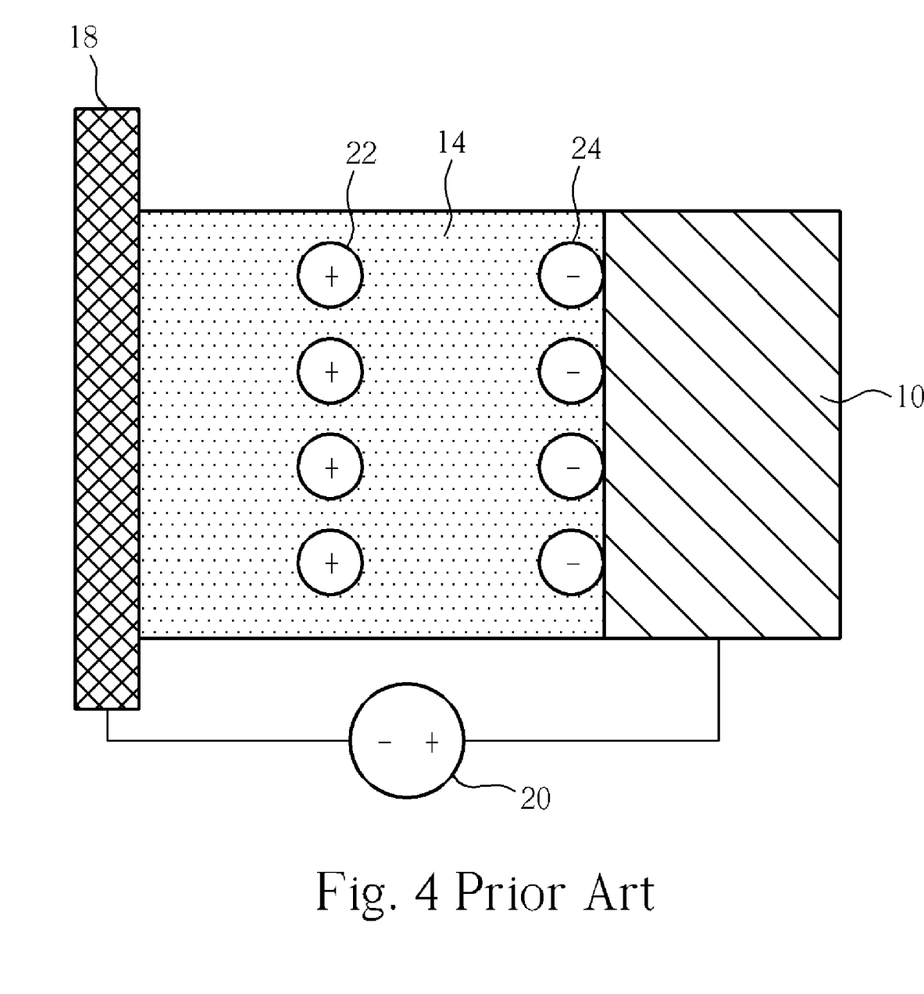
FIG. 4 is a schematic diagram illustrating the reaction condition of the ions in the glass wafer in the anodic bonding process.

Please refer to FIG. 4, and FIG. 4 is a schematic diagram illustrating the reaction condition of the ions in the glass wafer 14 in the anodic bonding process. As shown in FIG. 4, when the wafer 10 and the glass wafer 14 are provided with a high voltage between them and a high temperature, the sodium oxide ($Na_2O$) ions in the glass wafer 14 will be separated out the sodium ions ($Na^+$) 22 and the oxygen ions ($O^{2-}$) 24. The oxygen ions 24 will be concentrated on the interface between the wafer 10 and the glass wafer 14, and then, the oxygen ions 24 will be reacted with the silicon atoms to form the silicon-oxygen ($Si-O_x$) covalent bonds so that the wafer 10 and the glass wafer 14 are bonded to each other ($Si+2O^{2-} \rightarrow SiO_2$). The sodium ions 24 will move to the plate 18 and be combined with the electrons to form the sodium atoms (Na) ($4Na^+ + 4e^- \rightarrow 4Na$). However, the sodium atoms will be attached to the surface of the glass wafer 14, and the sodium atoms cannot be removed by cleaning in the following process so that the optical device caps cannot have good penetrability. Therefore, the penetrability of the optical package device will also be affected so as to reduce the optical function of the optical device.

SUMMARY OF THE INVENTION

It is therefore an object of the present invention to provide a method of fabricating optical device caps so as to have a good hermetic sealing, good penetrability and wafer level packaging.

According to the claimed invention, a method of fabricating optical device caps is provided. First, a wafer is provided, and a plurality of through holes is formed in the wafer. Then, a glass wafer is disposed on the wafer. Next, a plate is provided, and the plate is disposed on the glass wafer, wherein the plate has a plurality of concave cavities respectively corresponding to the through holes of the wafer so that a part of the plate corresponding to the through holes is not in contact with the glass wafer. Last, a voltage source is provided, and two electrodes of the voltage source are respectively electrically connected to the wafer and the plate so as to generate a voltage difference between the wafer and the plate. At the same time, the anodic bonding process is used to bond the wafer to the glass wafer so that a plurality of optical device caps is formed.

The method of fabricating optical device caps of the present invention uses a specific designed plate and an anodic bonding process to provide a glass wafer having clearness, high penetrability and no contamination. Therefore, the problem of having the sodium attached on the glass wafer that cannot be cleaned is solved, and the optical device caps can have a good penetrability.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
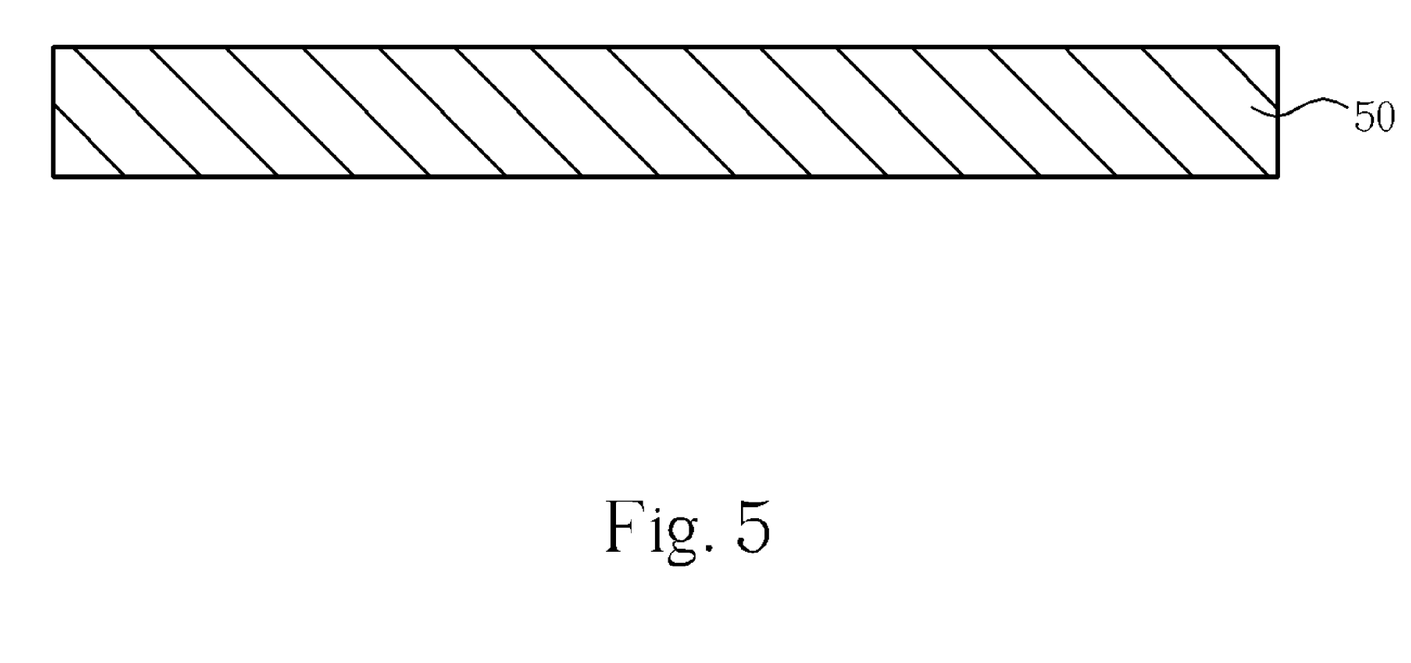
FIG. 5 through FIG. 11 are schematic diagrams illustrating a method of fabricating optical device caps.
Figure 6:
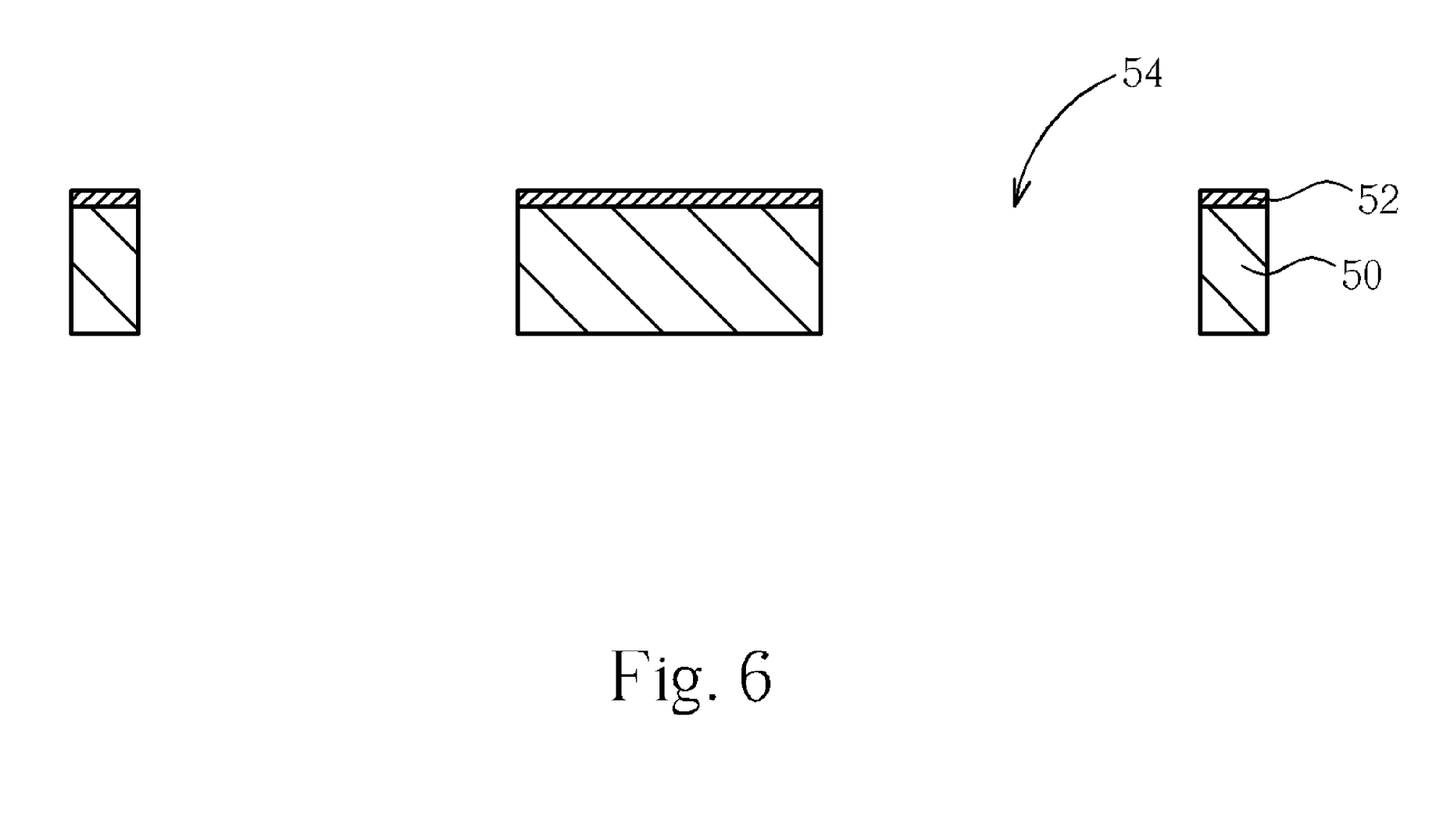
Figure 7:
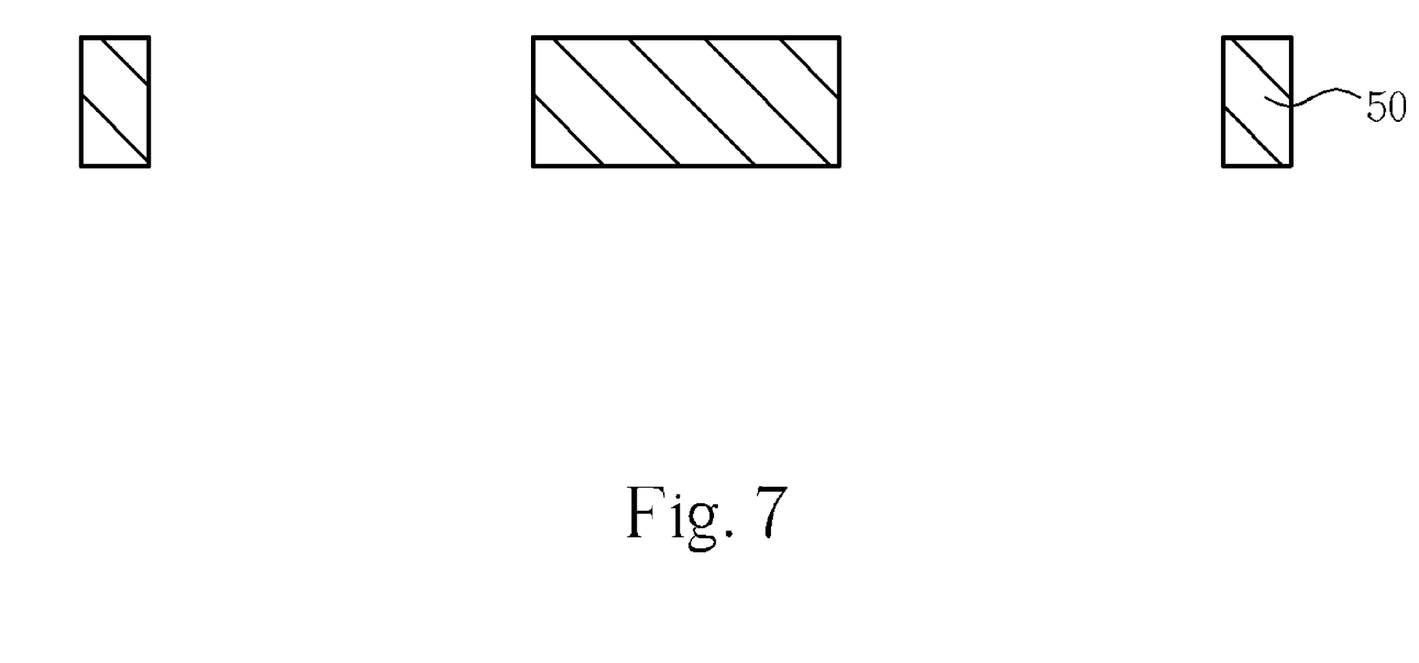

Please refer to FIG. 5 through FIG. 11. FIG. 5 through FIG. 11 are schematic diagrams illustrating a method of fabricating optical device caps. As shown in FIG. 5, a wafer 50, such as a silicon wafer, is provided, and then, a thinning process is performed to thin the wafer 50 to a required thickness. The thinning process includes a grinding process, a chemical mechanical polishing process, a plasma thinning process or a combination thereof. As shown in FIG. 6, a lithographic process forms a photoresist pattern 52, and then, regarding the photoresist pattern 52 as a mask, an etching process is performed to etch through a part of the wafer 50 not covered by the photoresist pattern 52 so that a plurality of through holes 54 is formed in the wafer 50. The etching process can be a dry etching process, such as a deep reactive ion etching (DRIE) process. As shown in FIG. 7, the photoresist pattern 52 is subsequently removed, and then, a clean process is performed.

Figure 8:
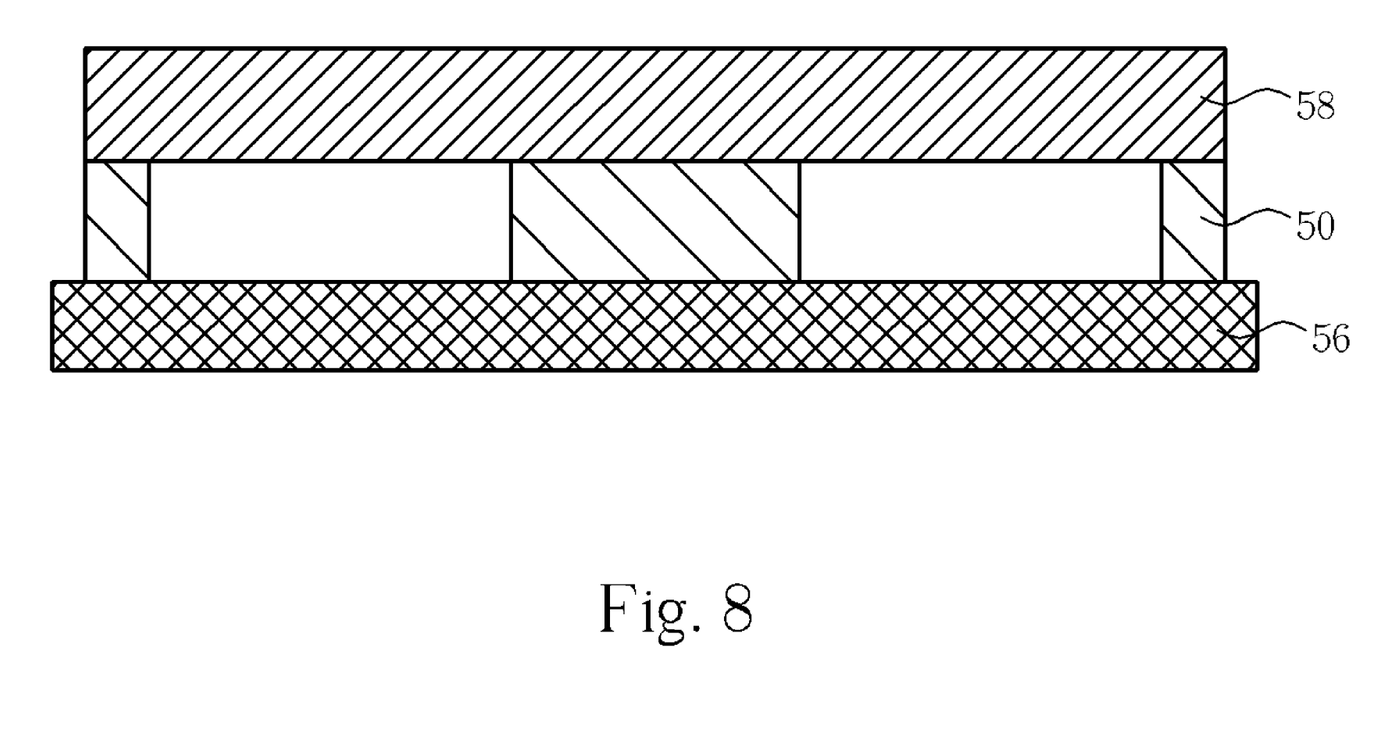
Figure 9:
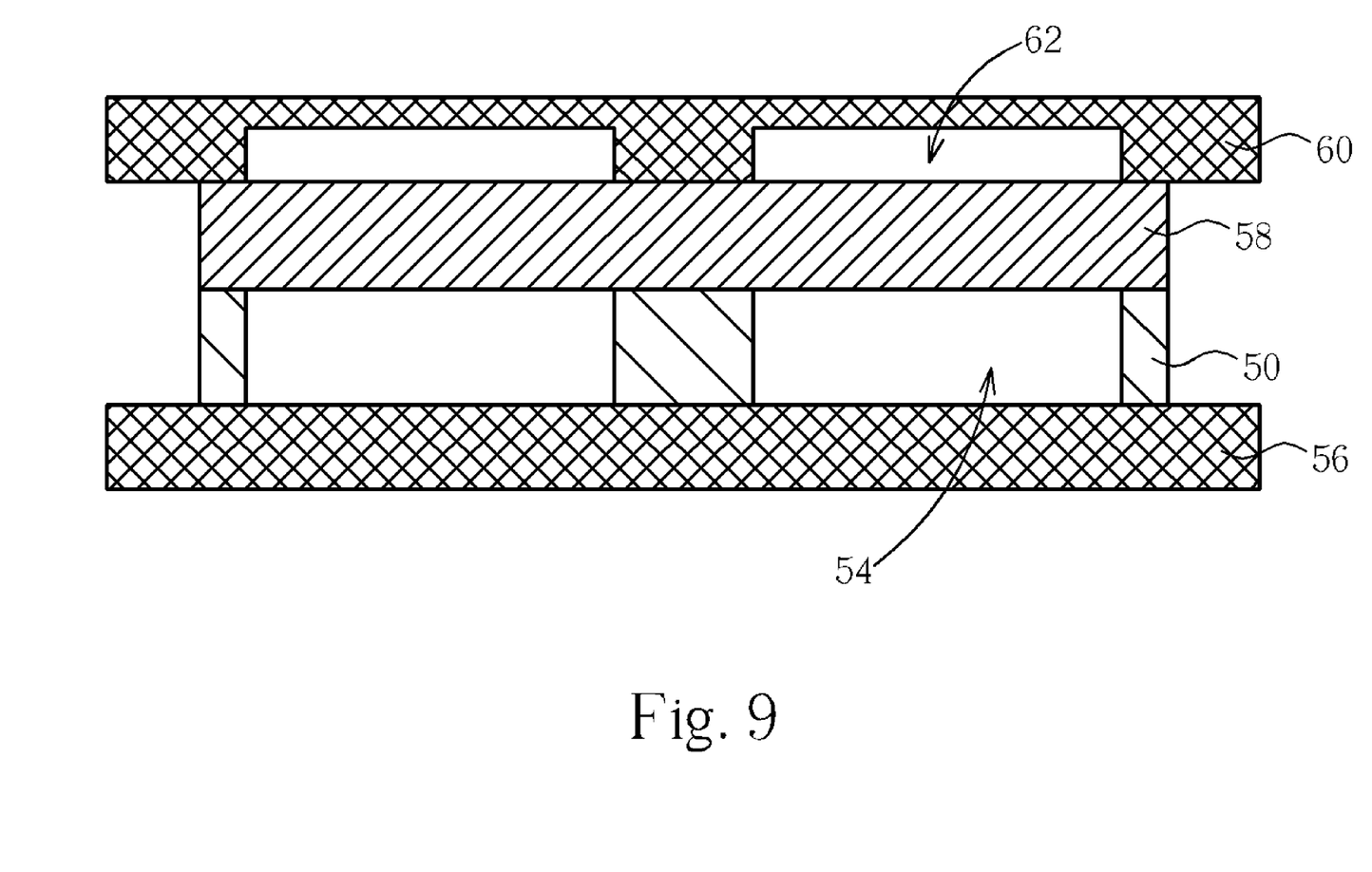

As shown in FIG. 8, the wafer 50 is disposed on the heat conducting plate 56, and a glass wafer 58 is disposed on the wafer 50. Then, the heat conducting plate 56 heats the wafer 50 and the glass wafer 58 to a temperature in a range from 200.degree. C. to 450.degree. C. The glass wafer 58 includes sodium oxide ions, such as the Pyrex 7740 glass produced by the Corning Company. As shown in FIG. 9, a plate 60 is provided, and the plate 60 is disposed on the glass wafer 58. The plate 60 has a plurality of concave cavities 62, and each concave cavity 62 is corresponding to one of the through hole 54 in the wafer 50 so that a part of the plate 60 corresponding to the through holes 54 is not in contact with the glass wafer 58.

Figure 10:
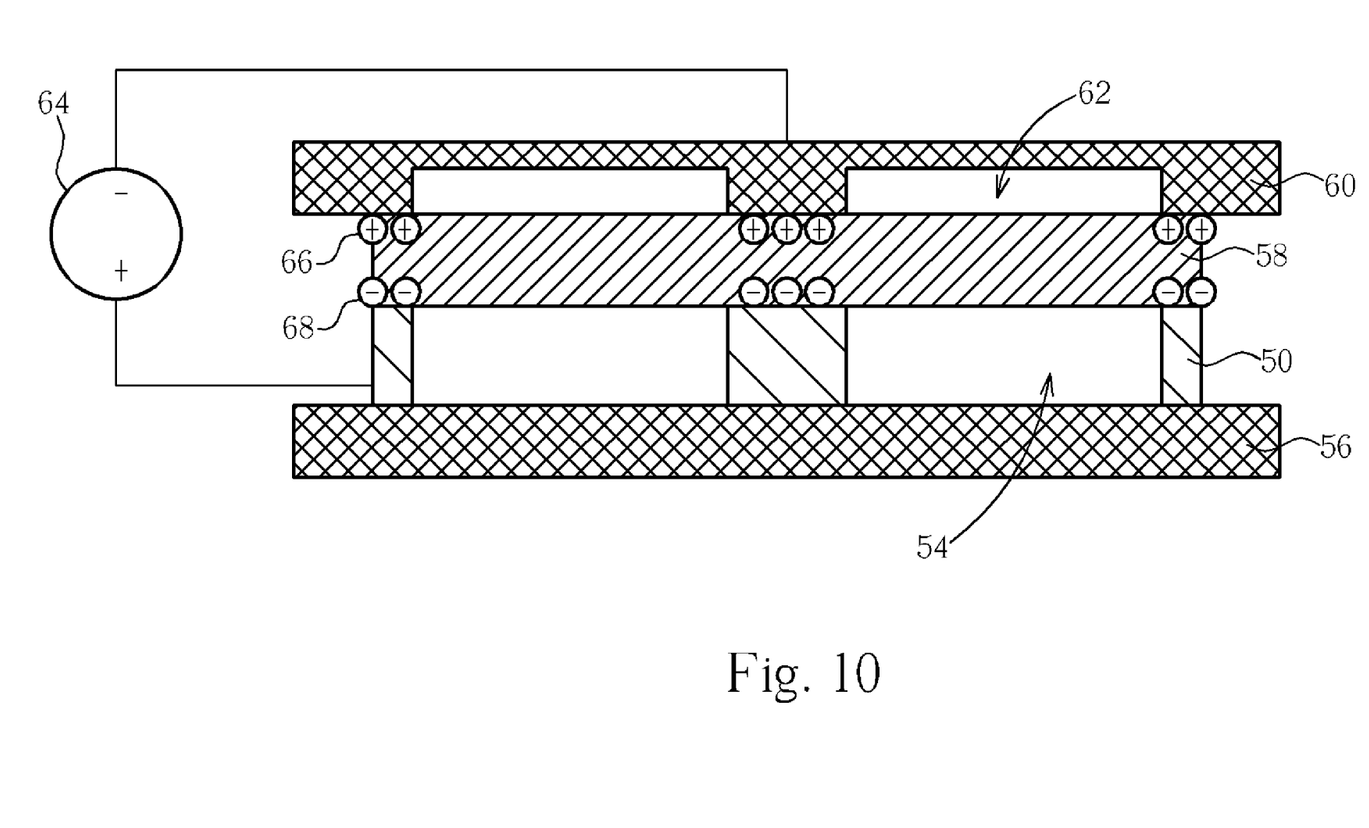
Figure 11:
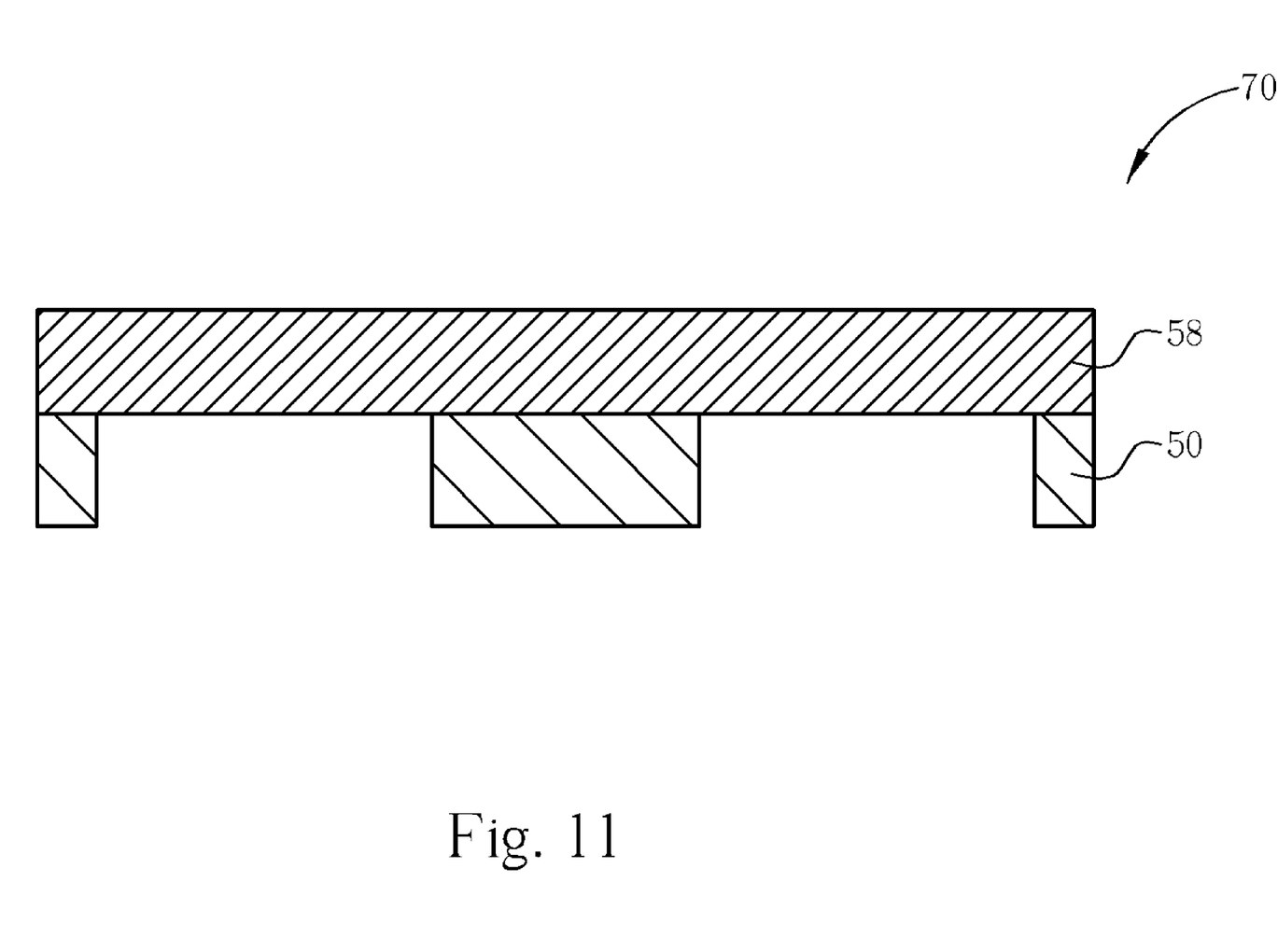

As shown in FIG. 10, a voltage source 64 is provided, and an anode and a cathode of the voltage source 64 are respectively electrically connected to the wafer 50 and the plate 60 so that a voltage difference in the range from 200 volts to 2000 volts between the wafer 50 and the plate 60 is generated. As shown in FIG. 11, the wafer 50 is bonded to the glass wafer 58 by an anodic bonding process so as to form a plurality of optical device caps 70. In this embodiment, the temperature of the anodic bonding process should be in the range from 200° C. to 450° C., and at the same time, the voltage should be in the range from 200 volts to 2000 volts so that the anodic bonding process can be performed. In the anodic bonding process, the sodium oxide ($Na_2O$) ions in the glass wafer 58 will be dissociated into sodium ions ($Na^+$) 66 and oxygen ions ($O^{2-}$) 68. The oxygen ions 68 will be concentrated on the interface between the wafer 50 and the glass wafer 58 and reacted with the silicon atoms (Si) in the wafer 50 to form silicon-oxygen ($Si-O_x$) covalent bonds ($Si+2O^{2-} \rightarrow SiO_2$), so the wafer 50 and the glass wafer 58 are bonded to each other because of the covalent bonds. The sodium ions 66 will move to the plate 60, and the sodium ions 66 will be combined with electrons to form sodium atoms (Na)($4Na^+ + 4e^- \rightarrow 4Na$). The sodium atoms will be attached on the glass wafer 58. In this embodiment, it should be noted that the plate 60 has a plurality of concave cavities 62 corresponding to the through holes 54 of the wafer 50 so that the part of the plate 60 corresponding to the through holes 54 is not in contact with the glass wafer 58. Therefore, in the anodic bonding process, the sodium ions 66 will only move to the plate 60 in contact with the glass wafer 58, and then, the sodium ions will be reacted with electrons in the plate 60. The sodium atoms will be only formed on the contact interface between the glass wafer 58 and the plate 60, so the surface of the glass wafer 58 not in contacted with the plate 60 will not have sodium atoms attached thereon. Therefore, the region of the glass wafer 58 not in contact with the plate 60 used for light penetrating is clear and not contaminated so that the packaged optical device caps 70 have good penetrability.

Figure 12:
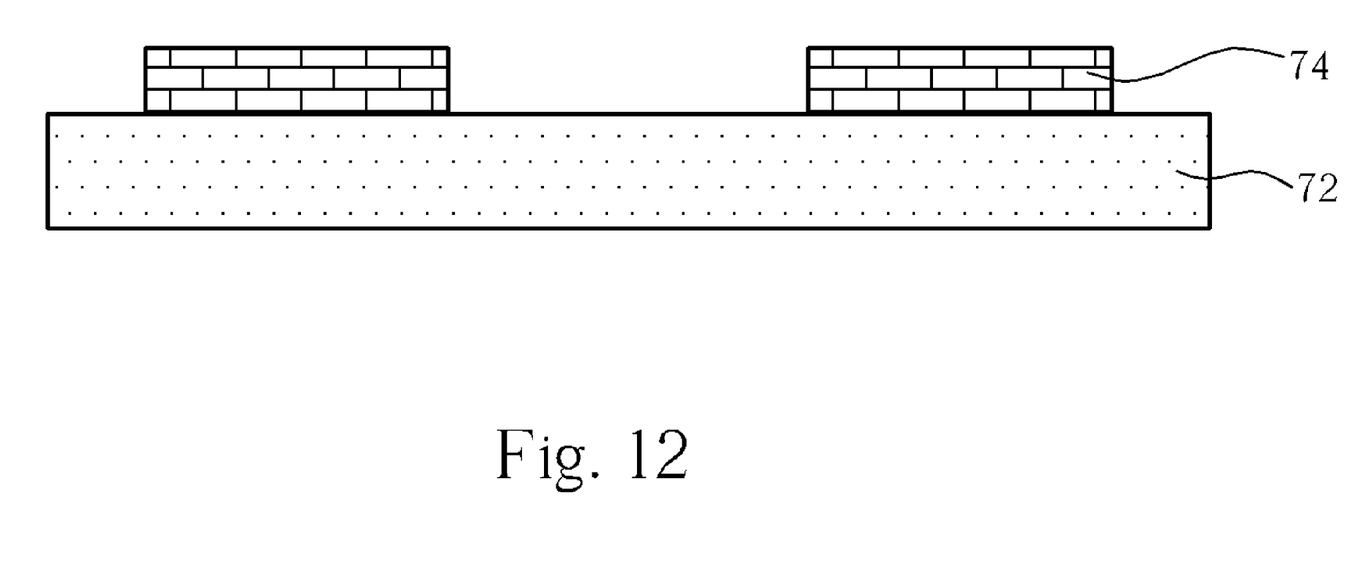
FIG. 12 through FIG. 14 are schematic diagrams illustrating an application method of the optical device caps to the device wafer.
Figure 13:
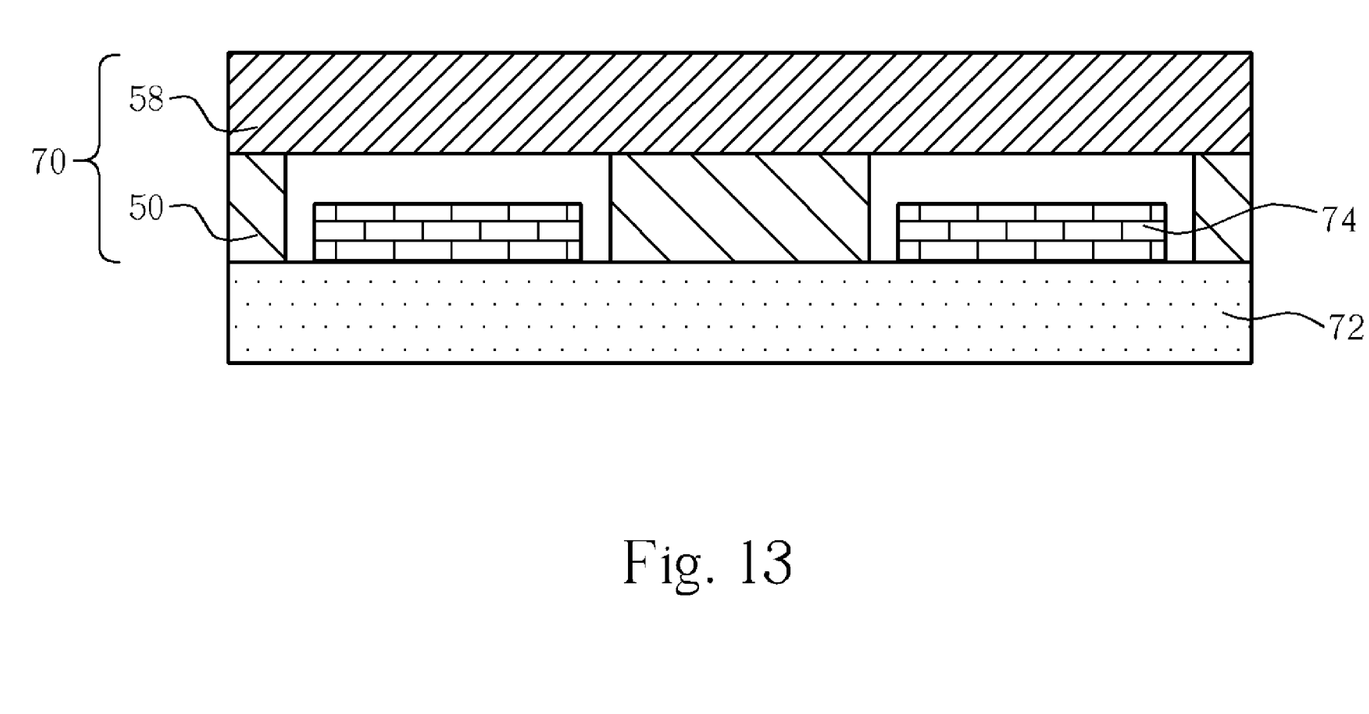
Figure 14:
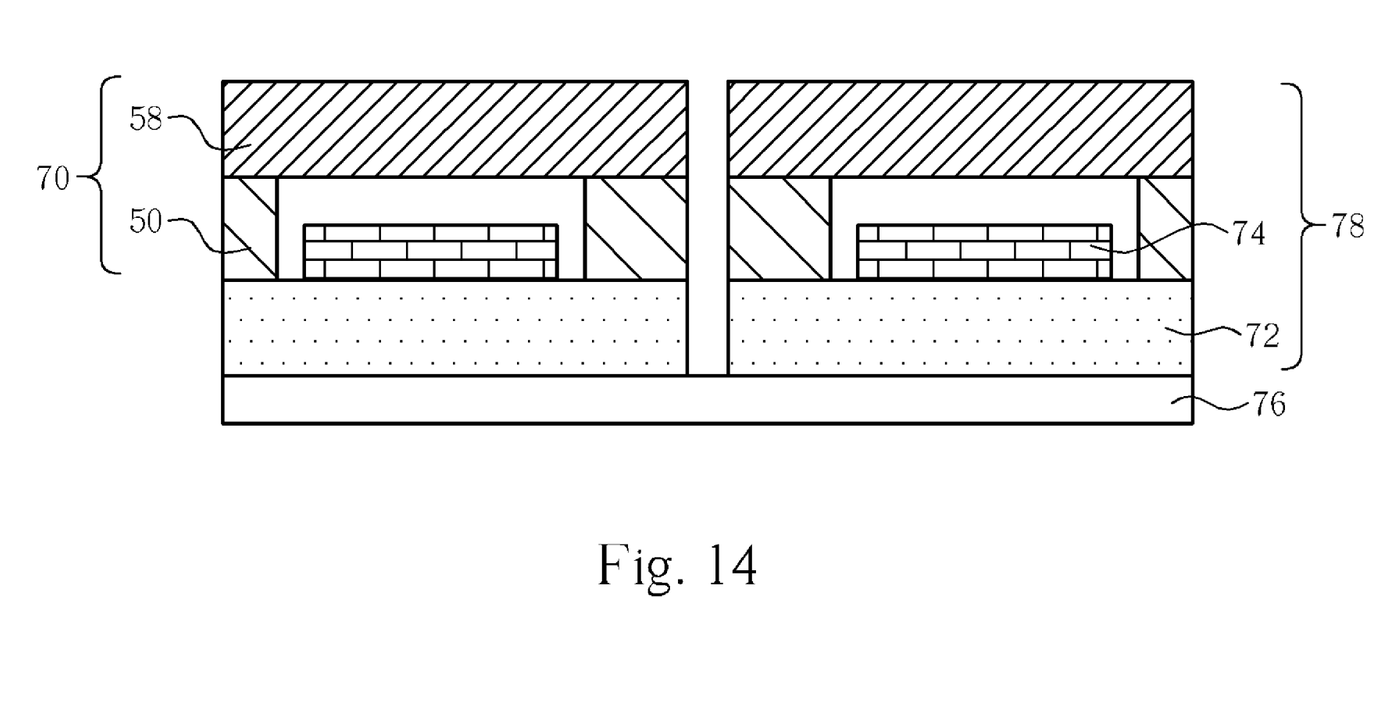

Please refer to FIG. 12 through FIG. 14. FIG. 12 through FIG. 14 are schematic diagrams illustrating an application method of the optical device caps to the device wafer. As shown in FIG. 12, a device wafer 72 is provided, and a surface of the device wafer 72 includes a plurality of optical devices 74, such as an optical sensor device or a light-emitting device, etc. As shown in FIG. 13, an alignment process is performed, and the optical device caps 70 are aligned to the position of the optical device 74 and attached to the device wafer 72. The optical device caps 70 and the device wafer 72 are hermetically bonded to each other by a eutectic bonding process or a glass frit bonding process. As shown in FIG. 14, the device wafer 72 is attached on a cutting tape 76, and a cutting process is performed to divide the device wafer 72 into a plurality of optical package devices 78. Each of the optical devices 72 has one of the optical device caps 70 thereon.

The method of fabricating optical device caps of the present invention uses a specific designed plate and anodic bonding process to let the light-penetrating region of the optical device caps not have sodium atoms. Therefore, The glass wafer for light penetrating having clearness, high penetrability and no contamination is provided, and the optical device caps with strong bonding force and hermetical bonding are provided through the silicon-oxygen covalent bonds produced by the anodic bonding process. The optical device caps bonded to the device wafer provides a protection to the optical device on the device wafer and a good penetrability so that the optical device can have a good optical function. In addition, the optical device caps in one process can support a plurality of optical devices, so the present invention also provides a simple, continuous and mass producible manufacturing method.

Those skilled in the art will readily observe that numerous modifications and alterations of the device and method may be made while retaining the teachings of the invention.

What is claimed is:

1. A method of fabricating optical device caps, comprising:
   providing a wafer, and forming a plurality of through holes in the wafer; disposing a glass wafer on the wafer;
   providing a plate, and disposing the plate on the glass wafer, wherein the plate has a plurality of concave cavities respectively corresponding to the through holes of the wafer so that a part of the plate corresponding to the through holes is not in contact with the glass wafer;
   providing a voltage source, electrically connecting two electrodes of the voltage source respectively to the wafer and the plate so as to generate a voltage difference between the wafer and the plate, and using an anodic bonding method to bond the wafer to the glass wafer so that a plurality of optical device caps are formed;
   removing the plate from the glass wafer.

2. The method of claim 1, further comprising disposing the wafer on a heat conducting plate while bonding the wafer to the glass wafer.

3. The method of claim 1, wherein an anode of the voltage source is connected to the wafer, and a cathode of the voltage source is connected to the plate.

4. The method of claim 1, wherein a step of forming the through holes comprises:
   performing a thinning process upon the wafer; and
   forming the through holes in the wafer by a lithographic process and an etching process.

5. The method of claim 4, wherein the thinning process comprises a grinding process, a chemical mechanical polishing process, a plasma thinning process or a combination thereof 6. The method of claim 1, further comprising:
   attaching the optical device caps to a device wafer comprising a plurality of optical devices after forming the optical device caps; and
   performing a cutting process to divide the device wafer into a plurality of optical package devices, and each of the optical devices having one of the optical device caps thereon.

* * * * *